(12) United States Patent
Wang (10) Patent No.: US 11,744,129 B2
(45) Date of Patent: Aug. 29, 2023

(54) PIXEL ARRANGEMENT STRUCTURE, DISPLAY PANEL AND DISPLAY APPARATUS

(71) Applicant: WUHAN CHINA STAR OPTOELECTRONICS SEMICONDUCTOR DISPLAY TECHNOLOGY CO., LTD., Hubei (CN)

(72) Inventor: Kun Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 338 days.

(21) Appl. No.: 17/266,390

(22) PCT Filed: Sep. 16, 2020

(86) PCT No.: PCT/CN2020/115444
§ 371 (c)(1),
(2) Date: Feb. 5, 2021

(87) PCT Pub. No.: WO2022/007192
PCT Pub. Date: Jan. 13, 2022

(65) Prior Publication Data
US 2022/0310704 A1    Sep. 29, 2022

(30) Foreign Application Priority Data

Jul. 7, 2020  (CN) .......................... 202010645622.5

(51) Int. Cl.
*H10K 59/35* (2023.01)

(52) U.S. Cl.
CPC ......... *H10K 59/353* (2023.02); *H10K 59/352* (2023.02)

(58) Field of Classification Search
CPC ........................... H10K 59/352; H10K 59/353
See application file for complete search history.

(56) References Cited

U.S. PATENT DOCUMENTS

| 10,411,076 B2 | 9/2019 | Kajiyama |
| 2015/0214280 A1* | 7/2015 | Furuie .................. H10K 59/352 257/89 |

(Continued)

FOREIGN PATENT DOCUMENTS

| CN | 206564254 U | 10/2017 |
| CN | 109037287 A | 12/2018 |

(Continued)

*Primary Examiner* — Eric K Ashbahian (57) ABSTRACT

The present invention provides a pixel arrangement structure, a display panel and a display apparatus, each of the plurality of pixel units in the pixel arrangement structure comprises blue sub-pixels, red sub-pixels, and green sub-pixels; the blue sub-pixels, the red sub-pixels, and the green sub-pixels form a center-symmetric pattern, a total area of the blue sub-pixels is greater than a total area of the red sub-pixels, and the total area of the red sub-pixels is greater than a total area of the green sub-pixels, so that there is no need to share sub-pixels with adjacent pixel units, thereby improving the display resolution, and the phenomena of color fringing and edge jagged can be avoided.

15 Claims, 8 Drawing Sheets

(56) References Cited

U.S. PATENT DOCUMENTS

| | | | | |
|---|---|---|---|---|
| 2016/0043148 A1* | 2/2016 | Wu | ............... | H10K 59/352 |
| | | | | 257/89 |
| 2019/0252469 A1* | 8/2019 | Xiao | ............... | H10K 59/122 |
| 2021/0399061 A1* | 12/2021 | Ji | ............... | H10K 59/353 |

FOREIGN PATENT DOCUMENTS

| | | |
|---|---|---|
| CN | 109377881 A | 2/2019 |
| CN | 109427851 A | 3/2019 |
| CN | 109994507 A | 7/2019 |
| CN | 109994509 A | 7/2019 |
| CN | 110137208 A | 8/2019 |
| CN | 110137210 A | 8/2019 |
| CN | 110323260 A | 10/2019 |
| CN | 110444569 A | 11/2019 |

\* cited by examiner

FIG. 8 he the present invention provides a
PIXEL ARRANGEMENT STRUCTURE, DISPLAY PANEL AND DISPLAY APPARATUS

FIELD OF INVENTION

The present invention relates to the field of display technology, in particular, to a pixel arrangement structure, a display panel and a display apparatus.

BACKGROUND OF INVENTION

In recent years, organic light-emitting diode (OLED) display technology has become more and more widely used due to its many advantages, such as self-luminescence, high contrast, thin thickness, wide viewing angles, and fast response speed.

In a full-color method of the OLED, a side-by-side pixelation of the three primary colors of red (R), green (G), and blue (B) is the most mature technology, however, since there are differences in the lifespan and efficiency of red, green, and blue organic luminescent materials, especially the lifespan and efficiency of blue organic luminescent materials are far inferior to those of green and red organic luminescent materials, if a traditional pixel arrangement structure is adopted, each sub-pixel has a same pixel area, the blue sub-pixels will decline in brightness in advance during the use of a screen, causing poor screen display or screen failure.

TECHNICAL PROBLEMS

Figure 1:
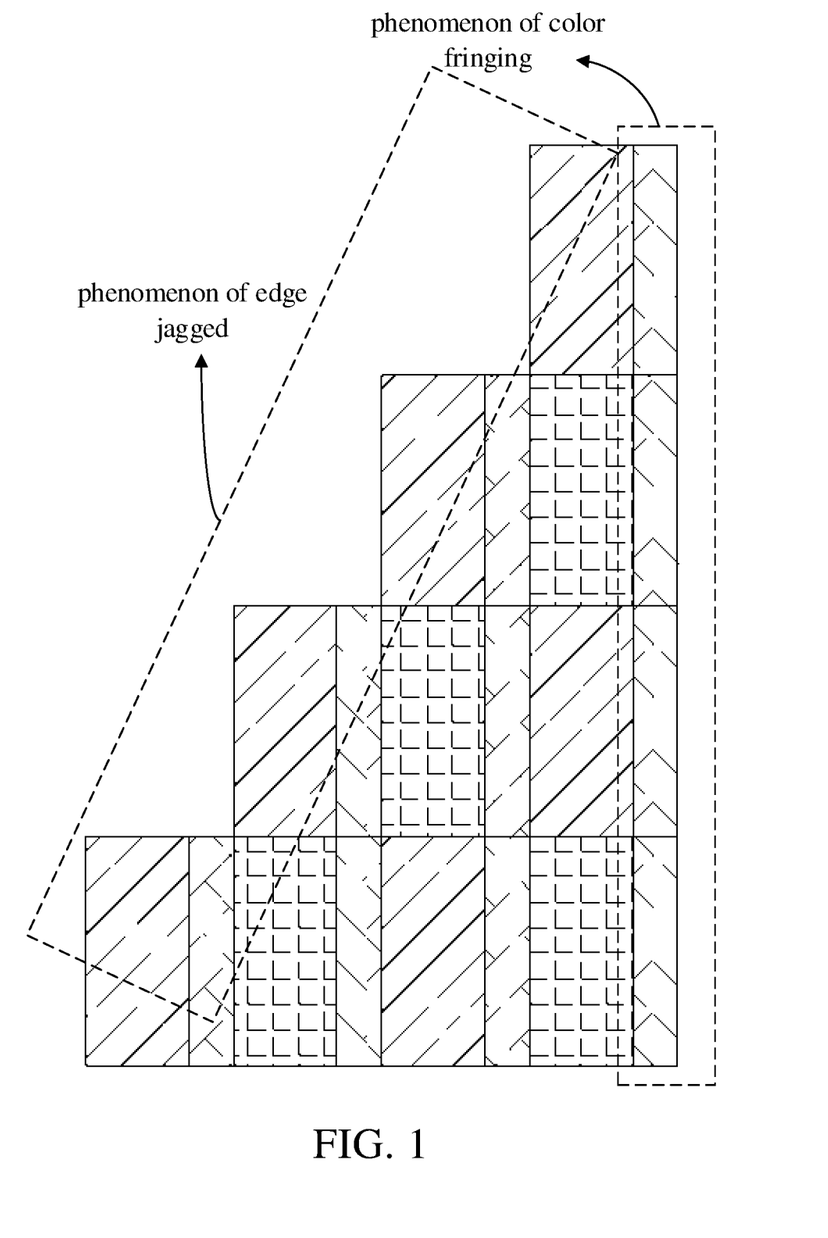
FIG. 1 is a schematic view of a traditional pentile-type pixel arrangement structure.

In order to solve the above-mentioned problem of inconsistent lifespan of the sub-pixels, a pentile-type pixel arrangement structure in which different sub-pixels are set to have different aperture ratios is generally adopted. However, as shown in FIG. 1, the pentile-type pixel arrangement structure suffers from phenomena of color fringing and edge jagged. Therefore, during the implementation process, the inventor(s) found that the traditional technology has at least the following problem: the display performance of the traditional pentile-type pixel arrangement structure is poor.

TECHNICAL SOLUTIONS

Based on the above, it is necessary to provide a pixel arrangement structure, a display panel, and a display apparatus to solve the problem of poor display performance of the traditional pentile-type pixel arrangement structure.

In order to achieve the foregoing objects, one aspect of the present invention provides a pixel arrangement structure, wherein the pixel arrangement structure comprises a plurality of pixel units arranged in an array;

each of the plurality of pixel units comprises blue sub-pixels, red sub-pixels, and green sub-pixels;

the blue sub-pixels, the red sub-pixels, and the green sub-pixels form a center-symmetric pattern, and each edge of the pattern is provided with any two kinds or three kinds of the blue sub-pixels, the red sub-pixels, and the green sub-pixels, respectively; and a total area of the blue sub-pixels is greater than a total area of the red sub-pixels, and the total area of the red sub-pixels is greater than a total area of the green sub-pixels.

Further, another aspect of the present invention provides a display panel comprising the forgoing pixel arrangement structure.

Further, yet another aspect of the present invention provides a display apparatus comprising the forgoing display panel.

BENEFICIAL EFFECTS

Each embodiment of the present invention provides a pixel arrangement structure, comprising a plurality of pixel units arranged in an array; wherein each of the plurality of pixel units comprises blue sub-pixels, red sub-pixels, and green sub-pixels; the blue sub-pixels, the red sub-pixels, and the green sub-pixels form a center-symmetric pattern; and a total area of the blue sub-pixels is greater than a total area of the red sub-pixels, and the total area of the red sub-pixels is greater than a total area of the green sub-pixels. Since each pixel unit in the pixel arrangement structure of the present invention comprises blue sub-pixels, red sub-pixels, and green sub-pixels, so that there is no need to share sub-pixels with adjacent pixel units, thereby improving the display resolution, and the pixel arrangement structure of the present invention can avoid the phenomena of color fringing and edge jagged, thus further improving the display performance.

PARTS LIST 1. pixel unit; 11. blue sub-pixel; 111. first blue sub-pixel; 113. second blue sub-pixel; 115. third blue sub-pixel; 13. red sub-pixel; 131. first red sub-pixel; 133. second red sub-pixel; 15. green sub-pixel; 151. first green sub-pixel; 153. second green sub-pixel; 17. white sub-pixel.

DETAILED DESCRIPTION OF EMBODIMENTS

In order to facilitate the understanding of the present invention, the present invention will be described in a more comprehensive manner with reference to the relevant drawings. The preferred embodiments of the present invention are shown in the drawings. However, the present invention can be implemented in many different forms and is not limited to the embodiments described herein. On the contrary, the purpose of providing these embodiments is to make the disclosure of the present invention more thorough and comprehensive.

It should be noted that when an element is considered to be "connected" to another element, it may be directly connected to and integrated with another element, or there may be a sandwiched element at the same time. The terms "dispose", "a side", "a long side" and similar expressions used herein are merely for illustrative purposes.

Unless otherwise defined, all technical and scientific terms used herein have the same meaning as commonly understood by those skilled in the technical field of the present invention. The terms used in the description of the present invention are merely for the purpose of describing specific embodiments, and are not intended to limit the present invention. The term "and/or" used herein includes any and all combinations of one or more related listed items.

The adjacent pixel units in the traditional pentile-type pixel arrangement structure share sub-pixels, resulting in a decrease in resolution. Moreover, an edge of the traditional pentile-type pixel arrangement structure occurs a phenomenon of color fringing that contains merely sub-pixels of one color. In order to solve the phenomenon of color fringing, the sub-pixels that should be extinguished in the traditional pentile-type pixel arrangement structure are lit to display normal colors, however, the edges will be uneven and jagged, such that burrs appear on a screen of the traditional pentile-type pixel arrangement structure.

In order to solve the problem of poor display performance of the traditional pentile-type pixel arrangement structure caused by the above reasons, in one embodiment of the present invention, as shown in FIGS. 2 to 5, a pixel arrangement structure is provided, the pixel arrangement structure comprises a plurality of pixel units arranged in an array;

each of the plurality of pixel units 1 comprises blue sub-pixels 11, red sub-pixels 13, and green sub-pixels 15;

the blue sub-pixels 11, the red sub-pixels 13, and the green sub-pixels 15 form a center-symmetric pattern, and each edge of the pattern is provided with any two kinds or three kinds of the blue sub-pixels 11, the red sub-pixels 13, and the green sub-pixels 15;

a total area of the blue sub-pixels 11 is greater than a total area of the red sub-pixels 13, and the total area of the red sub-pixels 13 is greater than a total area of the green sub-pixels 15.

It should be noted that the pixel arrangement structure comprises a plurality of pixel units 1 with same structure, and the plurality of pixel units 1 are regularly arranged in columns and rows to form an array arrangement.

Each of the plurality of pixel units 1 comprises blue sub-pixels 11, red sub-pixels 13, and green sub-pixels 15, thus there is no need to share sub-pixels with an adjacent pixel unit 1, thereby improving the display resolution. Further, the blue sub-pixels 11, the red sub-pixels 13 and the green sub-pixels 15 form a center-symmetric pattern that can be completely overlapped after rotating 180 degrees around a center of the pattern. In one example, the blue sub-pixels 11, the red sub-pixels 13, and the green sub-pixels 15 form a square pattern.

In order to solve the phenomenon of color fringing, each side of the above pattern is provided with any two kinds or three kinds of the blue sub-pixels 11, the red sub-pixels 13, and the green sub-pixels 15. Specifically, one side may comprise red sub-pixels and green sub-pixels 15, red sub-pixels and blue sub-pixels 11, blue sub-pixels and green sub-pixels 15, or red sub-pixels, blue sub-pixels and green sub-pixels 15. For example, in one example, an outer contour of the center-symmetric pattern is a rectangle, and the two opposite sides of the rectangle comprise sub-pixels of two colors, while the other two opposite sides comprise sub-pixels of three colors.

Since the lifespan and efficiency of organic light-emitting materials of different colors are different, the lifespan of the blue sub-pixels 11 is shorter than that of the red sub-pixels 13 and the lifespan of the red sub-pixels 13 is shorter than that of the green sub-pixels 15 under a same aperture ratio. Sub-pixels with shorter lifespan will prematurely decline in brightness, leading to a poor display performance. To solve this problem, in the pixel arrangement structure, a total area of the blue sub-pixel 11 is greater than that of the red sub-pixels 13; a total area of the red sub-pixels 13 is greater than that of the green sub-pixels 15. For the best display performance, the blue sub-pixels 11, the red sub-pixels 13 and the green sub-pixels 15 may have a same or equal lifespan by means of area matching.

Figure 2:
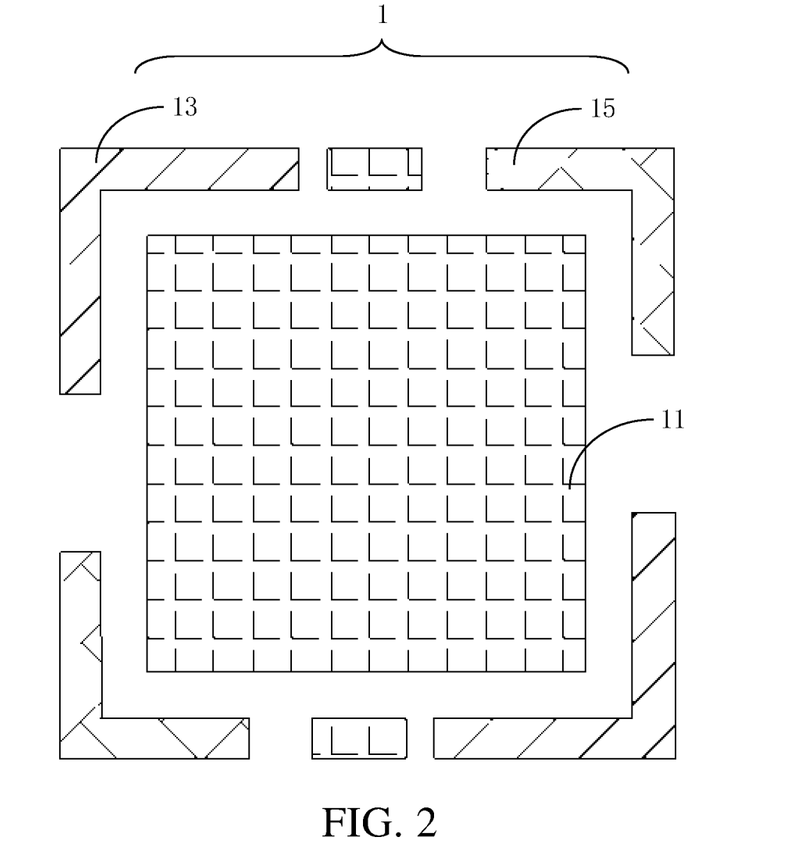
FIG. 2 is a first schematic view of a pixel unit in an embodiment.
Figure 3:
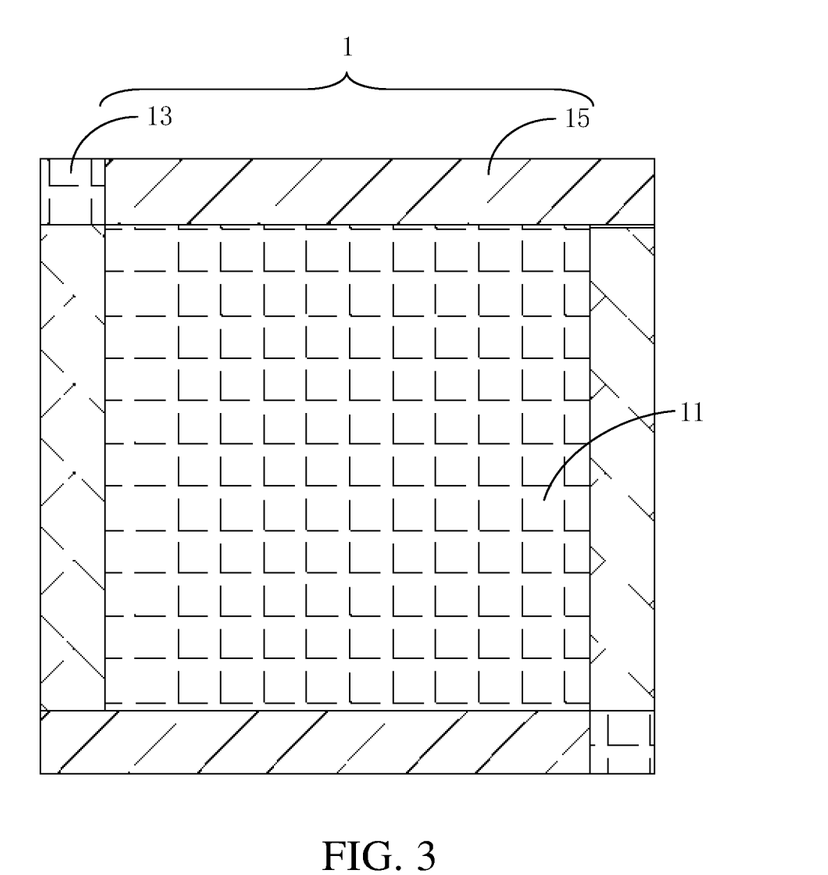
FIG. 3 is a second schematic view of a pixel unit in an embodiment.

In one example, as shown in FIG. 2, a provided pixel arrangement structure comprises three blue sub-pixels 11, two red sub-pixels 13, and two green sub-pixels 15. In another example, as shown in FIG. 3, a provided pixel arrangement structure comprises three blue sub-pixels 11, two red sub-pixels 13, and two green sub-pixels 15.

Figure 4:
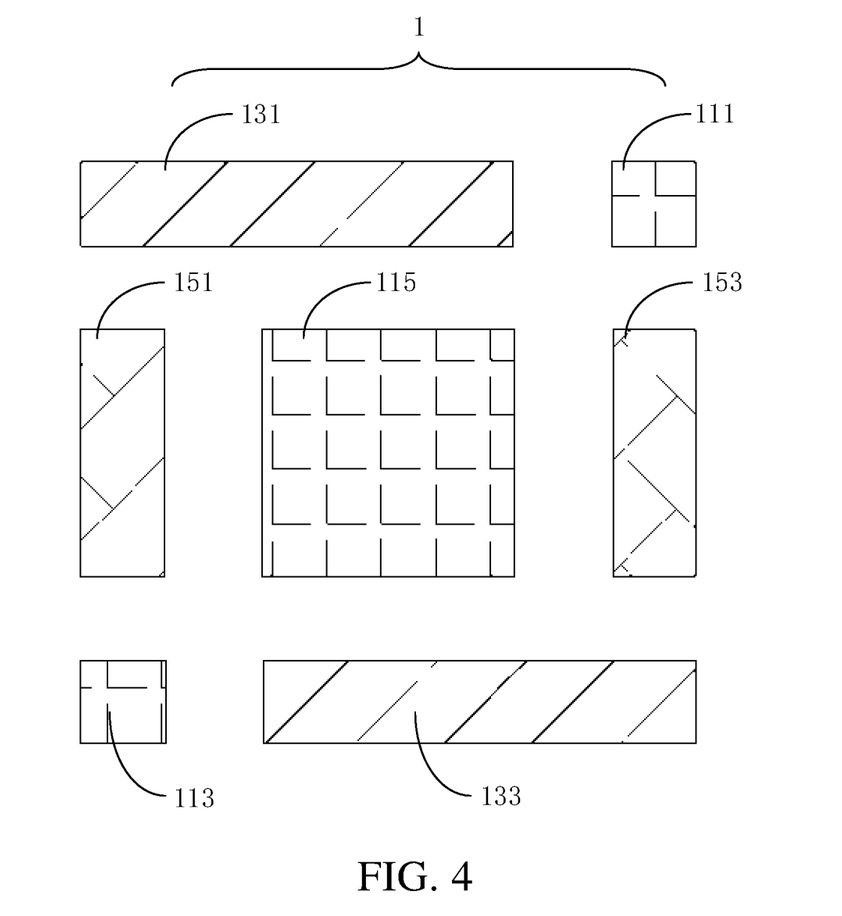
FIG. 4 is a third schematic view of a pixel unit in an embodiment.
Figure 5:
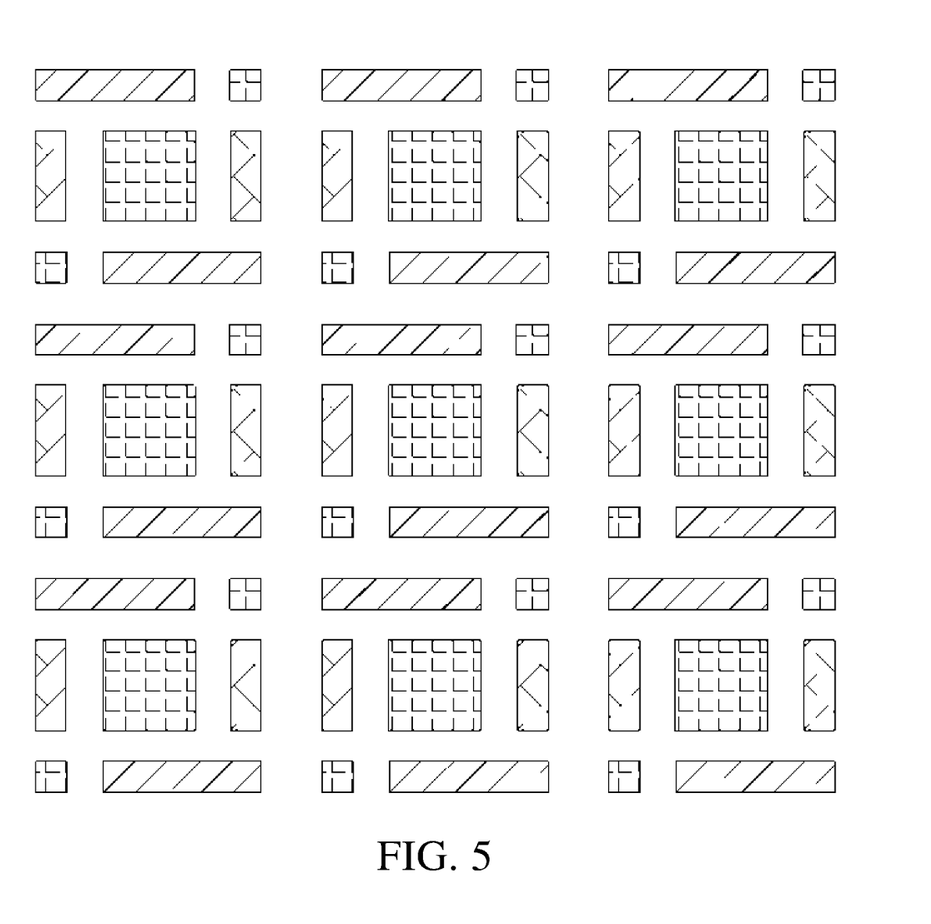
FIG. 5 is a schematic view of a pixel arrangement structure in an embodiment.

In one example, as shown in FIGS. 4 and 5, the blue sub-pixels 11 comprise a first blue sub-pixel 111, a second blue sub-pixel 113, and a third blue sub-pixel 115; the red sub-pixels 13 comprise a first red sub-pixel 131 and a second red sub-pixel 133; and the green sub-pixels 15 comprise a first green sub-pixel 151 and a second green sub-pixel 153;

the first blue sub-pixel 111, the first red sub-pixel 131, the first green sub-pixel 151, the second blue sub-pixel 113, the second red sub-pixel 133, and the second green sub-pixel 153 are disposed around the third blue sub-pixel 115 in sequence;

the first blue sub-pixel 111 and the second blue sub-pixel 113 are arranged centrally symmetric with respect to a center of the third blue sub-pixel 115;

the first red sub-pixel 131 and the second red sub-pixel 133 are arranged centrally symmetric with respect to the center of the third blue sub-pixel 115; and the first green sub-pixel 151 and the second green sub-pixel 153 are arranged centrally symmetric with respect to the center of the third blue sub-pixel 115.

It should be noted that, "the first blue sub-pixel 111, the first red sub-pixel 131, the first green sub-pixel 151, the second blue sub-pixel 113, the second red sub-pixel 133, and the second green sub-pixel 153 are disposed around the third blue sub-pixel 115 in sequence" means that the first blue sub-pixel 111, the first red sub-pixel 131, the first green sub-pixel 151, the second blue sub-pixel 113, the second red sub-pixel 133, and the second green sub-pixel 153 are circumferentially arranged along an outer contour of the third blue sub-pixel 115.

The first blue sub-pixel 111 and the second blue sub-pixel 113 are arranged centrally symmetric with respect to the center of the third blue sub-pixel 115, that is, the first blue sub-pixel 111 and the second blue sub-pixel 113 have a same shape and structure, and are arranged centrally symmetric. The first red sub-pixel 131 and the second red sub-pixel 133 are arranged centrally symmetric with respect to a center of the third red sub-pixel 13, that is, the first red sub-pixel 131 and the second red sub-pixel 133 have a same shape and structure, and are arranged centrally symmetric. The first green sub-pixel 151 and the second green sub-pixel 153 are arranged centrally symmetric with respect to a center of the third green sub-pixel 15, that is, the first green sub-pixel 151 and the second green sub-pixel 153 have a same shape and structure, and are arranged centrally symmetric.

The shape and structure of the first blue sub-pixel 111, the first red sub-pixel 131, the first green sub-pixel 151, the second blue sub-pixel 113, the second red sub-pixel 133, the second green sub-pixel 153, and the third blue sub-pixel 115 can be determined according to actual needs.

In one example, as shown in FIGS. 4 and 5, the first blue sub-pixel 111, the second blue sub-pixel 113, and the third blue sub-pixel 115 are square sub-pixels, and the first blue sub-pixel 111 and the second blue sub-pixels 113 are square sub-pixels with same side length; the first red sub-pixel 131 and the second red sub-pixel 133 are rectangular sub-pixels with same length and width; and the first green sub-pixel 151 and the second green sub-pixel 153 are rectangular sub-pixels with same length and width. In this example, a side length of the third blue sub-pixel 115 is larger than the side length of the first blue sub-pixel 111 and the side length of the second blue sub-pixel 113.

In each embodiment, a total area of the first blue sub-pixel 111, the second blue sub-pixel 113, and the third blue sub-pixel 115 is greater than a total area of the first red sub-pixel 131 and the second red sub-pixel 133; and the total area of the first red sub-pixel 131 and the second red sub-pixel 133 is greater than a total area of the first green sub-pixel 151 and the second green sub-pixel 153.

In order to meet the above area requirements of the sub-pixels, in one example, as shown in FIGS. 4 and 5, a width of the first red sub-pixel 131 is equal to a side length of the first blue sub-pixel 111, a length of the first red sub-pixel 131 is equal to a sum of the side length of the first blue sub-pixel 111, a side length of the third blue sub-pixel 115, and a preset length; and a width of the first green sub-pixel 151 is equal to the side length of the first blue sub-pixel 111, and a length of the first green sub-pixel 151 is equal to the side length of the third blue sub-pixel 115. Among them, the preset length can be determined according to actual needs.

In order to make the pixel arrangement structure more regular to improve its display performance, in one example, as shown in FIGS. 4 and 5, the first blue sub-pixel 111, the first red sub-pixel 131, the first green sub-pixel 151, the second blue sub-pixel 113, the second red sub-pixel 133, and the second green sub-pixel 153 surround a square region; a side of the third blue sub-pixel 115 is parallel to a long side of the first red sub-pixel 131, and the third blue sub-pixel 131 is disposed in a middle of the square region; and the preset length is equal to a width of a gap between the first blue sub-pixel 111 and the first red sub-pixel 131.

It should be noted that the first red sub-pixel 131 and the second red sub-pixel 133 are centrally symmetrically arranged on two sides of the third blue sub-pixel 115, and the first green sub-pixel 151 and the second green sub-pixel 153 are centrally symmetrically arranged on the other two sides of the third blue sub-pixel 115, the first blue sub-pixel 111 and the second blue sub-pixel 113 are centrally symmetrically arranged on an extension of a diagonal of the third blue sub-pixel 115. An outer contour of the area surrounded by the first blue sub-pixel 111, the first red sub-pixel 131, the first green sub-pixel 151, the second blue sub-pixel 113, the second red sub-pixel 133, and the second green sub-pixel 153 is a square. An inner contour of the area surrounded by the first blue sub-pixel 111, the first red sub-pixel 131, the first green sub-pixel 151, the second blue sub-pixel 113, the second red sub-pixel 133, and the second green sub-pixel 153 is a square.

Figure 6:
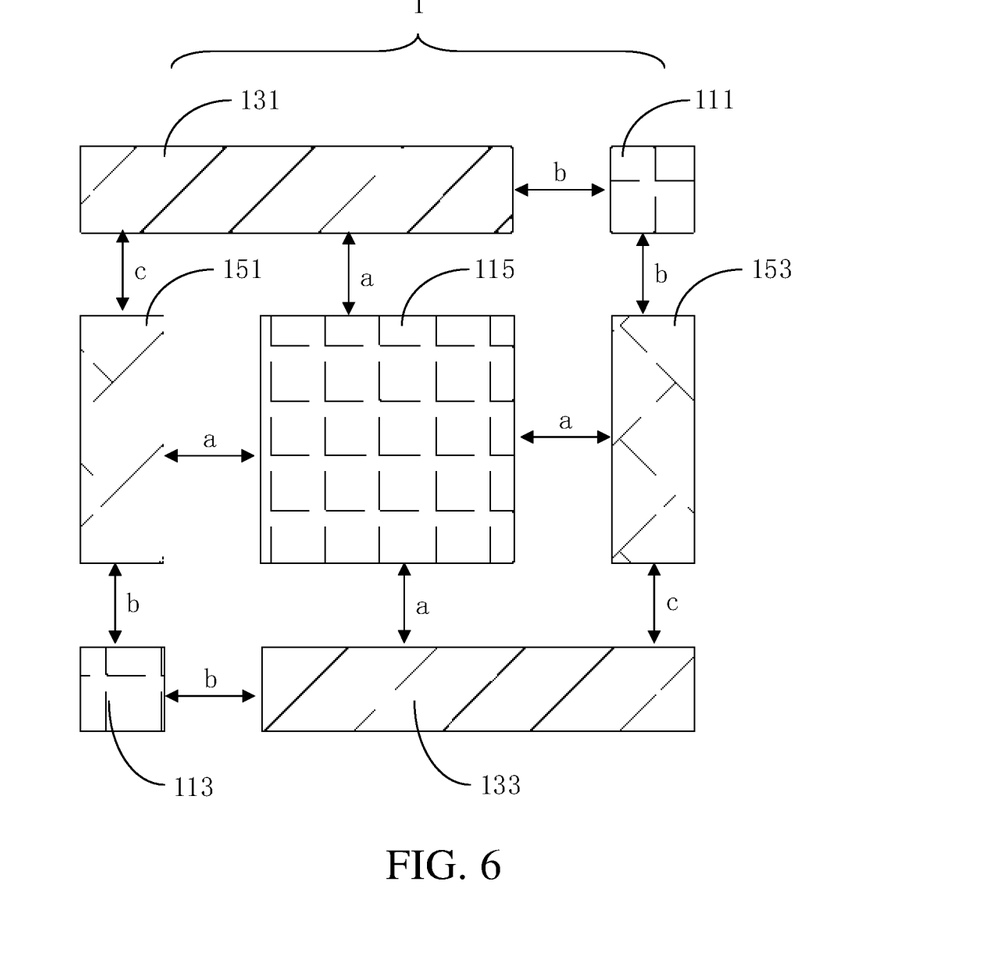
FIG. 6 is a schematic view of gaps of sub-pixels in a pixel unit in an embodiment.

Further, as shown in FIG. 6, a gap "a" is defined between the third blue sub-pixel 115 and the first red sub-pixel 131, the third blue sub-pixel 115 and the first green sub-pixel 151, the third blue sub-pixel 115 and the second red sub-pixel 133, and the third blue sub-pixel 115 and the second green sub-pixel 153; a gap "b" is defined between the blue sub-pixel 11 and the adjacent red sub-pixel 13 and the green sub-pixel 15; and a gap "c" is defined between the green sub-pixel 15 and the red sub-pixel 13, the gap "a", the gap "b", and the gap "c" are all equal to the preset length.

The manufacturing process of the above-mentioned pixel arrangement structure is: using a fine metal mask with a first opening size; forming red sub-pixels 13 in respective openings of a pixel definition layer by evaporation or ink-jet printing, etc.; using a fine metal mask with a second opening size; forming blue sub-pixels 11 in respective openings of the pixel definition layer by evaporation or ink-jet printing, etc.; using a fine metal mask with a third opening size; and forming green sub-pixels 15 in respective openings of the pixel definition layer by evaporation or ink-jet printing, etc. During the actual manufacturing process, the forming sequence of the red, green and blue sub-pixels 11 can be changed. The first opening, the second opening and the third opening have same areas as the sub-pixels of corresponding color, and their size is inversely proportional to the lifespan of the evaporated material.

In each embodiment of the pixel arrangement structure of the present invention, the pixel arrangement structure comprises a plurality of pixel units 1 arranged in an array; wherein each of the plurality of pixel units 1 comprises blue sub-pixels 11, red sub-pixels 13, and green sub-pixels 15; the blue sub-pixels 11, the red sub-pixels 13, and the green sub-pixels 15 form a center-symmetric pattern; a total area of the blue sub-pixels 11 is greater than a total area of the red sub-pixels 13, and the total area of the red sub-pixels 13 is greater than a total area of the green sub-pixels 15. Since each pixel unit 1 in the pixel arrangement structure of the present invention comprises blue sub-pixels 11, red sub-pixels 13, and green sub-pixels 15, so that there is no need to share sub-pixels with adjacent pixel units, thereby improving the display resolution, and the pixel arrangement structure of the present invention can avoid the phenomena of color fringing and edge jagged, thus further improving the display performance.

Figure 7:
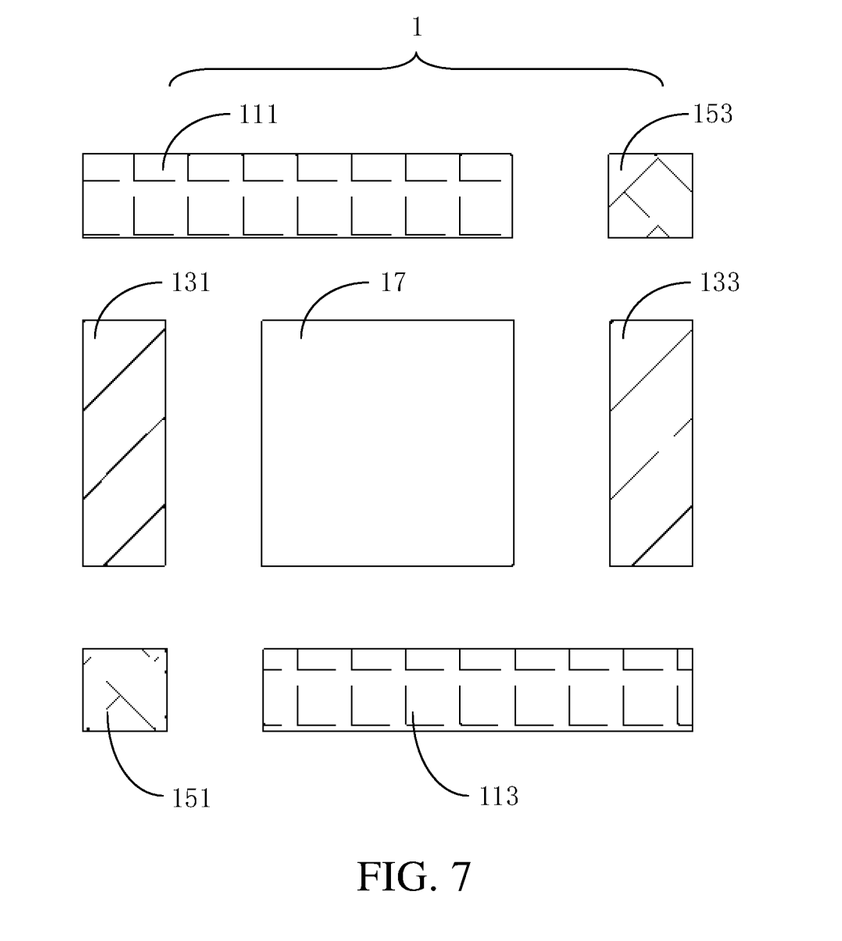
FIG. 7 is a schematic view of a pixel unit in another embodiment.
Figure 8:
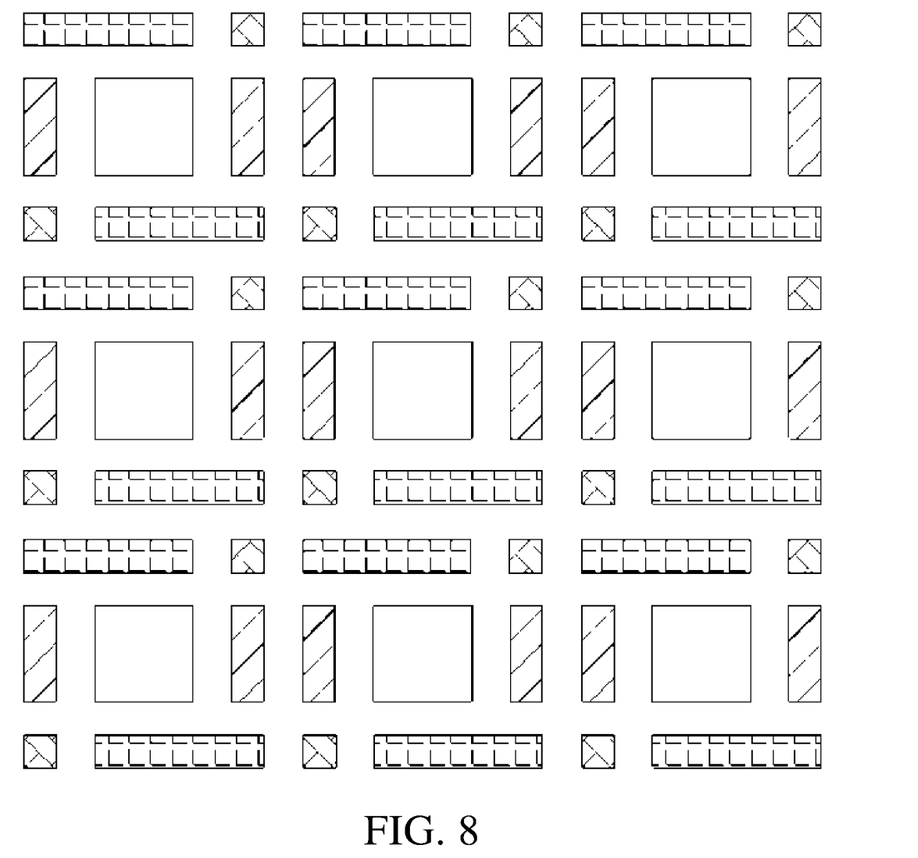
FIG. 8 is a schematic view of a pixel arrangement structure in another embodiment.

In one embodiment, as shown in FIGS. 7 and 8, a provided pixel arrangement structure comprises a plurality of pixel units 1 arranged in an array;

each of the plurality of pixel units 1 comprises blue sub-pixels 11, red sub-pixels 13, and green sub-pixels 15; and each of the plurality of pixel units 1 further comprises a white sub-pixel 17;

the blue sub-pixels 11, the red sub-pixels 13, and the green sub-pixels 15 are arranged around the white sub-pixel 17, and the blue sub-pixels 11, the red sub-pixels 13, the green sub-pixels 15, and the white sub-pixel 17 form a center-symmetric pattern; each edge of the pattern is provided with any two kinds or three kinds of the blue sub-pixels 11, the red sub-pixels 13 and the green sub-pixels 17;

a total area of the blue sub-pixels 11 is greater than a total area of the red sub-pixels 13, and the total area of the red sub-pixels 13 is greater than a total area of the green sub-pixels 15.

It should be noted that the pixel arrangement structure comprises a plurality of pixel units 1 with same structure, and the plurality of pixel units 1 are regularly arranged in columns and rows to form an array arrangement.

Each of the plurality of pixel units 1 comprises blue sub-pixels 11, red sub-pixels 13, green sub-pixels 15 and a white sub-pixel 17, thus there is no need to share sub-pixels with adjacent pixel units 1, thereby improving the display resolution. Further, the blue sub-pixels 11, the red sub-pixels 13, the green sub-pixels 15 and the white sub-pixel 17 form a center-symmetric pattern that can be completely overlapped after rotating 180 degrees around a center of the pattern. In one example, the blue sub-pixels 11, the red sub-pixels 13, the green sub-pixels 15 and the white sub-pixel 17 form a square pattern.

In order to solve the phenomenon of color fringing, each side of the above pattern is provided with any two kinds or three kinds of the blue sub-pixels 11, the red sub-pixels 13, and the green sub-pixels 15. Specifically, one side may comprise red sub-pixels and green sub-pixels 15, red sub-pixels and blue sub-pixels 11, blue sub-pixels and green sub-pixels 15, or red sub-pixels, blue sub-pixels and green sub-pixels 15. For example, in one example, an outer contour of the center-symmetric pattern is a rectangle, and the two opposite sides of the rectangle comprise sub-pixels of two colors, while the other two opposite sides comprise sub-pixels of three colors. In one example, the outer contour of the center-symmetric pattern is a square, and the two opposite sides of the square comprise sub-pixels of two colors, and the other two opposite sides comprise sub-pixels of three colors.

Since the lifespan and efficiency of organic light-emitting materials of different colors are different, the lifespan of the blue sub-pixels 11 is shorter than that of the red sub-pixels 13 and the lifespan of the red sub-pixels 13 is shorter than that of the green sub-pixels 15 under a same aperture ratio. Sub-pixels with shorter lifespan will prematurely decline in brightness, leading to a poor display performance. To solve this problem, in the pixel arrangement structure, a total area of the blue sub-pixel 11 is greater than that of the red sub-pixels 13; the total area of the red sub-pixels 13 is greater than that of the green sub-pixels 15. For the best display performance, the blue sub-pixels 11, the red sub-pixels 13 and the green sub-pixels 15 may have a same or equal lifespan by means of area matching.

In one example, the blue sub-pixels 11 comprise a first blue sub-pixel 111 and a second blue sub-pixel 113; the red sub-pixels 13 comprise a first red sub-pixel 131 and a second red sub-pixel 133; and the green sub-pixels 15 comprise a first green sub-pixel 151 and a second green sub-pixel 153;

the first blue sub-pixel 111, the first red sub-pixel 131, the first green sub-pixel 151, the second blue sub-pixel 113, the second red sub-pixel 133, and the second green sub-pixel 153 are disposed around the white sub-pixel 17 in sequence;

the first blue sub-pixel 111 and the second blue sub-pixel 113 are arranged centrally symmetric with respect to a center of the white sub-pixel 17;

the first red sub-pixel 131 and the second red sub-pixel 133 are arranged centrally symmetric with respect to the center of the white sub-pixel 17; and the first green sub-pixel 151 and the second green sub-pixel 153 are arranged centrally symmetric with respect to the center of the white sub-pixel 17.

It should be noted that, "the first blue sub-pixel 111, the first red sub-pixel 131, the first green sub-pixel 151, the second blue sub-pixel 113, the second red sub-pixel 133, and the second green sub-pixel 153 are disposed around the white sub-pixel 17 in sequence" means that the first blue sub-pixel 111, the first red sub-pixel 131, the first green sub-pixel 151, the second blue sub-pixel 113, and the second red sub-pixel 133 and the second green sub-pixel 153 are circumferentially arranged along an outer contour of the white sub-pixel 115.

The first blue sub-pixel 111 and the second blue sub-pixel 113 are arranged centrally symmetric with respect to a center of the white sub-pixel 17, that is, the first blue sub-pixel 111 and the second blue sub-pixel 113 have a same shape and structure, and are arranged centrally symmetric. The first red sub-pixel 131 and the second red sub-pixel 133 are arranged centrally symmetric with respect to a center of the third red sub-pixel 13, that is, the first red sub-pixel 131 and the second red sub-pixel 133 have a same shape and structure, and are arranged centrally symmetric. The first green sub-pixel 151 and the second green sub-pixel 153 are arranged centrally symmetric with respect to a center of the third green sub-pixel 15, that is, the first green sub-pixel 151 and the second green sub-pixel 153 have a same shape and structure, and are arranged centrally symmetric.

The shape and structure of the first blue sub-pixel 111, the first red sub-pixel 131, the first green sub-pixel 151, the second blue sub-pixel 113, the second red sub-pixel 133, the second green sub-pixel 153, and the white sub-pixel 115 can be determined according to actual needs.

In an example, the first blue sub-pixel 111 and the second blue sub-pixel 113 are square sub-pixels with same side length; the white sub-pixel 17 is a square sub-pixel; the first red sub-pixel 131 and the second red sub-pixel 133 are rectangular sub-pixels with same length and width; and the first green sub-pixel 151 and the second green sub-pixel 153 are rectangular sub-pixels with same length and width. In this example, the side length of the white sub-pixel 17 is larger than the side length of the first blue sub-pixel 111 and the side length of the second blue sub-pixel 113.

In each embodiment, a total area of the first blue sub-pixel 111 and the second blue sub-pixel 113 is greater than a total area of the first red sub-pixel 131 and the second red sub-pixel 133; and the total area of the first red sub-pixel 131 and the second red sub-pixel 133 is greater than a total area of the first green sub-pixel 151 and the second green sub-pixel 153.

In order to meet the above area requirements of the sub-pixels, in one example, a width of the first red sub-pixel 131 is equal to a side length of the first blue sub-pixel 111, a length of the first red sub-pixel 131 is equal to a sum of the side length of the first blue sub-pixel 111, a side length of the white sub-pixel 17, and a preset length; and a width of the first green sub-pixel 151 is equal to the side length of the first blue sub-pixel 111, and a length of the first green sub-pixel 151 is equal to the side length of the white sub-pixel 17. Among them, the preset length can be determined according to actual needs.

In order to make the pixel arrangement structure more regular to improve its display performance, in one example, the first blue sub-pixel 111, the first red sub-pixel 131, the first green sub-pixel 151, the second blue sub-pixel 113, the second red sub-pixel 133, and the second green sub-pixel 153 surround a square region;

a side of the white sub-pixel 17 is parallel to a long side of the first red sub-pixel 131, and the white sub-pixel 17 is disposed in a middle of the square region; and the preset length is equal to a width of a gap between the first blue sub-pixel 111 and the first red sub-pixel 131.

It should be noted that the first red sub-pixel 131 and the second red sub-pixel 133 are centrally symmetrically arranged on two sides of the white sub-pixel 17, and the first green sub-pixel 151 and the second green sub-pixel 153 are centrally symmetrically arranged on the other two sides of the white sub-pixel 17, the first blue sub-pixel 111 and the second blue sub-pixel 113 are centrally symmetrically arranged on an extension of a diagonal of the white sub-pixel 17. An outer contour of the area surrounded by the first blue sub-pixel 111, the first red sub-pixel 131, the first green sub-pixel 151, the second blue sub-pixel 113, the second red sub-pixel 133, and the second green sub-pixel 153 is a square. An inner contour of the area surrounded by the first blue sub-pixel 111, the first red sub-pixel 131, the first green sub-pixel 151, the second blue sub-pixel 113, the second red sub-pixel 133, and the second green sub-pixel 153 is a square.

Further, gaps defined between the white sub-pixel 17 and the first red sub-pixel 131, the white sub-pixel 17 and the first green sub-pixel 151, the white sub-pixel 17 and the second red sub-pixel 133, and the white sub-pixel 17 and the second green sub-pixel 153, gaps defined between the blue sub-pixel 11 and the adjacent red sub-pixel 13, and the blue sub-pixel 11 and the adjacent green sub-pixel 15, and gaps defined between the green sub-pixel 15 and the red sub-pixel 13 are all equal to the preset length.

The white sub-pixel 17 in the foregoing embodiment is formed by laminating or mixing at least one basic sub-pixel of a luminescent material of a necessary color for synthesizing white light and another luminescent material of a necessary color. The openings of the white sub-pixels 17 can be disposed on the first, second, and third openings of the fine metal masks in the foregoing embodiment, so that the red, green, and blue light-emitting materials are stacked in the pixel definition layer openings corresponding to the white sub-pixels 17.

In each embodiment of the pixel arrangement structure of the present invention, a white sub-pixel 17 is added into the pixel unit 1, and forms a new pixel unit 1 with the adjacent red sub-pixels, green sub-pixels, and blue sub-pixels 11, thereby not only improving the brightness and hue of a screen, effectively saving energy consumption, and extending the service life, but also increasing the pixel aperture ratio of the entire display panel. Moreover, compared with the traditional method of forming four pixels through four fine metal masks with small openings, the manufacturing process of the present invention saves at least one use of the fine metal masks, and the production cost is reduced.

In one embodiment, the present invention further provides a display panel comprising the forgoing pixel arrangement structure.

The display panel of the present invention has a high resolution, and does not exhibit the phenomena of color fringing and jagged edges.

In one embodiment, the present invention further provides a display apparatus comprising the forgoing display panel.

The display apparatus of the present application has a high resolution, and does not exhibit the phenomena of color fringing and jagged edges.

Technical features of the foregoing embodiments may be combined. For brevity of the description, not all possible combinations of the technical features in the foregoing embodiments are described. However, these combinations shall fall within the scope recorded in this specification as long as the combinations have no conflict.

The foregoing embodiments are merely some embodiments of the present invention, and descriptions thereof are relatively specific and detailed. However, it should not be understood as a limitation to the patent scope of the present invention. It should be noted that, a person of ordinary skill in the art may further make some variations and improvements without departing from the concept of the present invention, and the variations and improvements belong to the protection scope of the present invention. Therefore, the protection scope of the present invention shall be subject to the protection scope of the appended claims.

What is claimed is:

1. A pixel arrangement structure, comprising a plurality of pixel units arranged in an array;
    wherein each of the plurality of pixel units comprises blue sub-pixels, red sub-pixels, green sub-pixels, and a middle sub-pixel;
    the blue sub-pixels, the red sub-pixels, the green sub-pixels, and the middle sub-pixel form a center-symmetric pattern, and each edge of the pattern is provided with any two kinds or three kinds of the blue sub-pixels, the red sub-pixels, and the green sub-pixels;
    a total area of the blue sub-pixels is greater than a total area of the red sub-pixels, and the total area of the red sub-pixels is greater than a total area of the green sub-pixels;
    the blue sub-pixels comprise a first blue sub-pixel and a second blue sub-pixel, the red sub-pixels comprise a first red sub-pixel and a second red sub-pixel, and the green sub-pixels comprise a first green sub-pixel and a second green sub-pixel;
    the first blue sub-pixel, the first red sub-pixel, the first green sub-pixel, the second blue sub-pixel, the second red sub-pixel, and the second green sub-pixel are disposed around the middle sub-pixel in sequence;
    the first blue sub-pixel and the second blue sub-pixel are square sub-pixels with same side length, the first red sub-pixel and the second red sub-pixel are rectangular sub-pixels with same length and width, the first green sub-pixel and the second green sub-pixel are rectangular sub-pixels with same length and width, and the middle sub-pixel is a square sub-pixel;
    a width of the first red sub-pixel is equal to a side length of the first blue sub-pixel, a length of the first red sub-pixel is equal to a sum of the side length of the first blue sub-pixel, a side length of the middle sub-pixel, and a preset length; and
    a width of the first green sub-pixel is equal to the side length of the first blue sub-pixel, and a length of the first green sub-pixel is equal to the side length of the middle sub-pixel.

2. The pixel arrangement structure as claimed in claim 1, wherein
    the first blue sub-pixel and the second blue sub-pixel are arranged centrally symmetric with respect to a center of the middle sub-pixel;
    the first red sub-pixel and the second red sub-pixel are arranged centrally symmetric with respect to the center of the middle sub-pixel; and
    the first green sub-pixel and the second green sub-pixel are arranged centrally symmetric with respect to the center of the middle sub-pixel.

3. The pixel arrangement structure as claimed in claim 2, wherein the first blue sub-pixel, the first red sub-pixel, the first green sub-pixel, the second blue sub-pixel, the second red sub-pixel, and the second green sub-pixel surround a square region;
    a side of the middle sub-pixel is parallel to a long side of the first red sub-pixel, and the middle sub-pixel is disposed in a middle of the square region; and
    the preset length is equal to a width of a gap between the first blue sub-pixel and the first red sub-pixel.

4. The pixel arrangement structure as claimed in claim 1, wherein the pattern formed by the blue sub-pixels, the red sub-pixels, the green sub-pixels, and the middle sub-pixel is a square pattern.

5. The pixel arrangement structure as claimed in claim 1, wherein the middle sub-pixel is a third blue sub-pixel or a white sub-pixel.

6. A display panel, comprising a pixel arrangement structure;
    wherein the pixel arrangement structure comprises a plurality of pixel units arranged in an array;
    each of the plurality of pixel units comprises blue sub-pixels, red sub-pixels, green sub-pixels, and a middle sub-pixel;

the blue sub-pixels, the red sub-pixels, the green sub-pixels, and the middle sub-pixel form a center-symmetric pattern, and each edge of the pattern is provided with any two kinds or three kinds of the blue sub-pixels, the red sub-pixels, and the green sub-pixels;

a total area of the blue sub-pixels is greater than a total area of the red sub-pixels, and the total area of the red sub-pixels is greater than a total area of the green sub-pixels;

the blue sub-pixels comprise a first blue sub-pixel and a second blue sub-pixel, the red sub-pixels comprise a first red sub-pixel and a second red sub-pixel, and the green sub-pixels comprise a first green sub-pixel and a second green sub-pixel;

the first blue sub-pixel, the first red sub-pixel, the first green sub-pixel, the second blue sub-pixel, the second red sub-pixel, and the second green sub-pixel are disposed around the middle sub-pixel in sequence;

the first blue sub-pixel and the second blue sub-pixel are square sub-pixels with same side length, the first red sub-pixel and the second red sub-pixel are rectangular sub-pixels with same length and width, the first green sub-pixel and the second green sub-pixel are rectangular sub-pixels with same length and width, and the middle sub-pixel is a square sub-pixel;

a width of the first red sub-pixel is equal to a side length of the first blue sub-pixel, a length of the first red sub-pixel is equal to a sum of the side length of the first blue sub-pixel, a side length of the middle sub-pixel, and a preset length; and a width of the first green sub-pixel is equal to the side length of the first blue sub-pixel, and a length of the first green sub-pixel is equal to the side length of the middle sub-pixel.

7. The display panel as claimed in claim 6, wherein the first blue sub-pixel and the second blue sub-pixel are arranged centrally symmetric with respect to a center of the middle sub-pixel;

the first red sub-pixel and the second red sub-pixel are arranged centrally symmetric with respect to the center of the middle sub-pixel; and the first green sub-pixel and the second green sub-pixel are arranged centrally symmetric with respect to the center of the middle sub-pixel.

8. The display panel as claimed in claim 7, wherein the first blue sub-pixel, the first red sub-pixel, the first green sub-pixel, the second blue sub-pixel, the second red sub-pixel, and the second green sub-pixel surround a square region;

a side of the middle sub-pixel is parallel to a long side of the first red sub-pixel, and the middle sub-pixel is disposed in a middle of the square region; and the preset length is equal to a width of a gap between the first blue sub-pixel and the first red sub-pixel.

9. The display panel as claimed in claim 6, wherein the pattern formed by the blue sub-pixels, the red sub-pixels, the green sub-pixels, and the middle sub-pixel is a square pattern.

10. The display panel as claimed in claim 6, wherein the middle sub-pixel is a third blue sub-pixel or a white sub-pixel.

11. A display apparatus comprising a display panel comprising a pixel arrangement structure,
wherein the pixel arrangement structure comprises a plurality of pixel units arranged in an array;
each of the plurality of pixel units comprises blue sub-pixels, red sub-pixels, green sub-pixels, and a middle sub-pixel;

the blue sub-pixels, the red sub-pixels, the green sub-pixels, and the middle sub-pixel form a center-symmetric pattern, and each edge of the pattern is provided with any two kinds or three kinds of the blue sub-pixels, the red sub-pixels, and the green sub-pixels;

a total area of the blue sub-pixels is greater than a total area of the red sub-pixels, and the total area of the red sub-pixels is greater than a total area of the green sub-pixels;

the blue sub-pixels comprise a first blue sub-pixel and a second blue sub-pixel, the red sub-pixels comprise a first red sub-pixel and a second red sub-pixel, and the green sub-pixels comprise a first green sub-pixel and a second green sub-pixel;

the first blue sub-pixel, the first red sub-pixel, the first green sub-pixel, the second blue sub-pixel, the second red sub-pixel, and the second green sub-pixel are disposed around the middle sub-pixel in sequence;

the first blue sub-pixel and the second blue sub-pixel are square sub-pixels with same side length, the first red sub-pixel and the second red sub-pixel are rectangular sub-pixels with same length and width, the first green sub-pixel and the second green sub-pixel are rectangular sub-pixels with same length and width, and the middle sub-pixel is a square sub-pixel;

a width of the first red sub-pixel is equal to a side length of the first blue sub-pixel, a length of the first red sub-pixel is equal to a sum of the side length of the first blue sub-pixel, a side length of the middle sub-pixel, and a preset length; and a width of the first green sub-pixel is equal to the side length of the first blue sub-pixel, and a length of the first green sub-pixel is equal to the side length of the middle sub-pixel.

12. The display apparatus as claimed in claim 11, wherein the first blue sub-pixel and the second blue sub-pixel are arranged centrally symmetric with respect to a center of the middle sub-pixel;

the first red sub-pixel and the second red sub-pixel are arranged centrally symmetric with respect to the center of the middle sub-pixel; and the first green sub-pixel and the second green sub-pixel are arranged centrally symmetric with respect to the center of the middle sub-pixel.

13. The display apparatus as claimed in claim 12, wherein the first blue sub-pixel, the first red sub-pixel, the first green sub-pixel, the second blue sub-pixel, the second red sub-pixel, and the second green sub-pixel surround a square region;

a side of the middle sub-pixel is parallel to a long side of the first red sub-pixel, and the middle sub-pixel is disposed in a middle of the square region; and the preset length is equal to a width of a gap between the first blue sub-pixel and the first red sub-pixel.

14. The display apparatus as claimed in claim 11, wherein the pattern formed by the blue sub-pixels, the red sub-pixels, the green sub-pixels, and the middle sub-pixel is a square pattern.

15. The display apparatus as claimed in claim 11, wherein the middle sub-pixel is a third blue sub-pixel or a white sub-pixel.

* * * * *